(12) United States Patent
Miyoshi

(10) Patent No.: US 6,225,241 B1
(45) Date of Patent: May 1, 2001

(54) CATALYTIC DEPOSITION METHOD FOR A SEMICONDUCTOR SURFACE PASSIVATION FILM

(75) Inventor: Yosuke Miyoshi, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/007,543

(22) Filed: Jan. 15, 1998

(30) Foreign Application Priority Data

Jan. 20, 1997 (JP) .................................................. 9-007648

(51) Int. Cl.$^7$ ......................... H01L 21/31; H01L 21/469
(52) U.S. Cl. ......................... 438/794; 438/791; 438/792; 438/793; 438/778
(58) Field of Search .................................. 438/167, 794, 438/791, 792, 793, 778, 758

(56) References Cited

U.S. PATENT DOCUMENTS

| | | | |
|---|---|---|---|
| 5,043,299 | * | 8/1991 | Chang et al. ........................ 437/192 |
| 5,731,235 | * | 3/1998 | Srinivasan et al. .................. 438/253 |

FOREIGN PATENT DOCUMENTS 4-286126     10/1992     (JP) .

OTHER PUBLICATIONS by M.R. Matthews et al., "Comparative Reliability Study of GaAa Power MESFETs: Mechanisms for Surface–Induced Degradiation and a Reliable Solution", *Electronics Letters*, vol. 21, No. 3, Jan. 1985, pp. 115–116.

Matsumura, "Low Temperature Deposition of Silicon Nitride by the Catalytic Chemical Vapor Deposition Method," Jap. J. Appl. Phys., vol. 28, No. 10 Oct., 1989, pp. 2157–2161.*

* cited by examiner

*Primary Examiner*—Carl Whitehead, Jr.
*Assistant Examiner*—Neal Berezny
(74) *Attorney, Agent, or Firm*—Young & Thompson

(57) ABSTRACT

To provide a fabrication method of compound semiconductor devices which can improve the problems of conventional MESFETs, such as the breakdown voltage degradation owing to increase of the gate leak current or the electron traps in the passivation film, the drain current decrease because of the gate-lag, or the threshold voltage dispersion caused by the interfacial tension, and easily restrain the emitter-size effect of conventional mesa type HBT without revising or complicating its epitaxial layer structure, a fabrication method according to the invention of a semiconductor device having a high-resistance film (9) covering a part of a surface other than electrodes (5, 6, and 7) of the semiconductor device comprises a step of depositing the high-resistance film (9) by way of catalytic CVD. The fabrication method preferably further comprises a step of surface cleaning performed before the step of depositing for cleaning the surface of the semiconductor device by a gas including active hydrogen flowing on the surface. As for the high-resistance film, a material including no oxygen such as SiN is applied.

3 Claims, 5 Drawing Sheets

CATALYTIC DEPOSITION METHOD FOR A SEMICONDUCTOR SURFACE PASSIVATION FILM

BACKGROUND OF THE INVENTION

The present invention relates to a fabrication method of semiconductor devices, and particularly to that of semiconductor devices having compound semiconductor substrate.

Compound semiconductor materials such as gallium-arsenide (GaAs) or indium-phosphide (InP) have higher electron mobility than silicon (Si), and researches and developments of high-power and high-frequency (microwave or millimeter-wave band) FETs (Field Effect Transistors) making use of the compound semiconductor materials are actively pursued now.

In the high-power compound semiconductor FETs, there is sometimes found a phenomenon where drain current, and consequently, output power decreases during usage. This phenomenon is reported to be owing to active layer erosion of the element brought out by progress of electrochemical oxidation of the semiconductor surface during the usage, and is avoidable by providing a surface passivation film of silicon nitride (SiN), in pp. 115–116, ELECTRONICS LETTERS, vol. 21, No. 3, January 1985.

FIGS. 4A to 4D are cross sections schematically illustrating fabrication processes of a conventional high-power GaAs FET, a MESFET (MEtal-Semiconductor FET), by way of example.

Firstly, a mask pattern 8 is printed with photo-resist, for example, on a surface of an n-type GaAs layer 2 on a semi-insulating GaAs substrate 1 for forming a recess 3 by etching a part of n-type GaAs layer 2 of about 300 nm thickness, as illustrated in FIG. 4A.

Then, whole surface of the n-type GaAs layer 2 is covered with SiN film 20 of about 300 nm thickness deposited from monosilane ($SiH_4$) and ammonia ($NH_3$) gas, by way of plasma enhanced CVD (Chemical Vapor Deposition), and the SiN film 20 is etched for forming an opening 4 as illustrated in FIG. 4B, making use of a photo-resist mask, for example.

Then, a metallic film of WSi, for example, is formed on the whole surface of the substrate 1 by sputtering, which is masked with a photo-resist, for example, and etched for forming a gate electrode 5, as illustrated in FIG. 4C.

Then, a source electrode 6 and a drain electrode 7 are formed with liftoff technique as illustrated in FIG. 4D in openings configured by etching the SiN film 20 making use of a photo-resist mask, for example.

Thus, a MESFET having a structure as illustrated in FIG. 4D is obtained.

HBTs (Heterojunction Bipolar Transistors) made of compound semiconductor materials are also expected as promising devices for high-power and high-frequency amplifiers, and research and development thereof are active as well. Among them, emitter-top type AlGaAs/GaAs HBTs having a mesa structure are most developed now.

In these mesa type HBTs, when device size thereof is made fine for improving high-frequency performance, a problem called the emitter-size effect becomes important, wherein recombination current flowing out at the edge of emitter mesa becomes large compared to the base current, resulting in current gain decline.

As a method for reducing the emitter-size effect, there is disclosed a guard-ring technique in a Japanese patent application laid open as a Provisional Publication No. 286126/'92, for example, wherein a ledge structure, that is, an extrinsic base protection layer of about 50 nm thickness is provided around the emitter mesa.

However, there are problems in these prior arts.

In the MESFET of FIGS. 4A to 4D, the SiN surface passivation film 20 is deposited by plasma enhanced CVD, and so, the surface of the n-type GaAs layer 2 is damaged by the plasma and binding of Ga and As is weakened there. Hence, a low resistance part 10 is formed on the surface traversing the gate 5 and the drain 7 as illustrated in FIG. 5, because of As estranged during the usage. The low resistance part 10 degrades breakdown voltage because of increase of the gate leak current. This is a problem.

Further, electron traps are also derived on the surface of the n-type GaAs layer 2 damaged by the plasma, which are charged and discharged with a longer time constant than that of the designed element (phenomenon called the gate-lag) when the element operates at a high frequency, decreasing effective drain current.

Still further, the SiN film 20 deposited by the plasma enhanced CVD includes hydrogen of 20 to 30 atom %. According to these free hydrogen atoms, electron traps are derived also in the SiN film 20, which degrade too the breakdown voltage by charging and discharging themselves when electric field is impressed.

Besides these problems, the SiN film 20 deposited by the plasma enhanced CVD has compressive internal stress of about $3 \times 10^9$ dyn/cm². Therefore, piezoelectricity is generated in the n-type GaAs layer 2 according to interfacial tension between the n-type GaAs layer 2 and the SiN film 20, which becomes a cause of the threshold voltage dispersion of the narrow gate FET. This is another problem.

As for the above described HBT having the extrinsic base protection layer, it must have such an epitaxial layer structure that a narrow band-gap material of InGaAs layer is inserted between the emitter layer and the base layer for precisely configuring the extrinsic base protection layer. However, there is a problem that electrons are charged in the InGaAs layer, generating a potential barrier which decreases emitter current, besides the problem of the complicated epitaxial layer structure needing intricate and high-cost processes for developing its lamination.

SUMMARY OF THE INVENTION

Therefore, a primary object of the present invention is to provide a fabrication method of compound semiconductor devices which can improve the problems above described of the prior MESFET, such as the breakdown voltage degradation owing to increase of the gate leak current or the electron traps in the surface passivation film, the drain current decrease because of the gate-lag, or the threshold voltage dispersion caused by the interfacial tension.

Another object of the invention is to provide a fabrication method of compound semiconductor devices which can easily restrain the emitter-size effect of the prior mesa type HBT, without revising or complicating its epitaxial layer structure.

In order to achieve the object, a fabrication method according to the invention of a semiconductor device, having a high-resistance film covering a part of a surface other than electrodes of the semiconductor device, comprises a step of depositing the high-resistance film by way of catalytic CVD.

The fabrication method preferably further comprises a step of surface cleaning performed before the step of depositing for cleaning the surface of the semiconductor device by a gas including active hydrogen flowing on the surface.

As for the high-resistance film, a material including no oxygen such as SiN is applied.

In the catalytic CVD, material gases are cracked and made active by contacting catalyzer surface of high temperature. The activated material gases react in the same way with those in the thermal CVD. Further, in the catalytic CVD, the temperature of the catalyzer can be controlled independent of the substrate temperature. Therefore, a deposition film having the same quality can be obtained with lower substrate temperature in the catalytic CVD than in the thermal CVD.

BRIEF DESCRIPTION OF THE DRAWINGS

The foregoing, further objects, features, and advantages of this invention will become apparent from a consideration of the following description, the appended claims, and the accompanying drawings wherein the same numerals indicate the same or the corresponding parts.

In the drawings.

DETAILED DESCRIPTION OF THE PREFERRED EMBODIMENTS

Figure 1A:
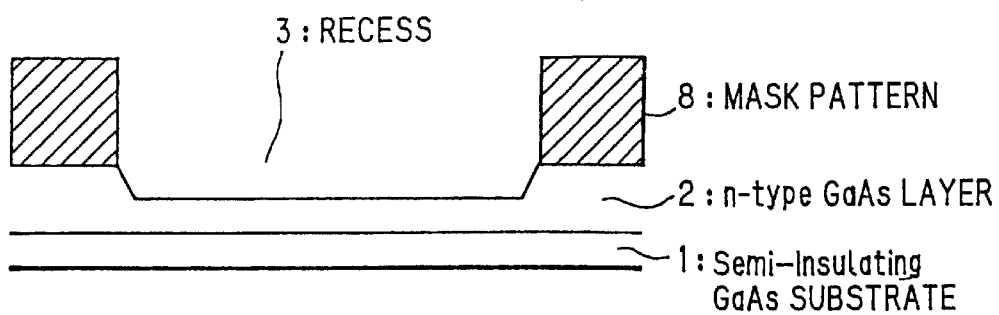
FIGS. 1A to 1D are cross sections schematically illustrating fabrication processes of a MESFET according to a first embodiment of the invention.

Now, embodiments of the present invention will be described in connection with the drawings.

FIGS. 1A to 1D are cross sections schematically illustrating fabrication processes of a FET according to a first embodiment of the invention. In FIGS. 1A to 1D, a MESFET is grown on a compound substrate 1, by way of example. However, this embodiment can be also applied to fabrication of other type FETs having different epitaxial layer structures such as a HEMT (High Electron Mobility Transistor) or a HFET (Hetero-structure FET), or having different gate electrode configuration such as an insulated gate FET.

In the first embodiment, a surface passivation film 9 made of SiN is deposited by way of catalytic CVD on a semiconductor surface other than a gate electrode 5, a source electrode 6 and a drain electrode 7.

Firstly, a mask pattern 8 is printed with a photo-resist material, for example, on a surface of an n-type GaAs layer 2 on a semi-insulating GaAs substrate 1 as illustrated in FIG. 1A, and a recess 3 is configured by etching a part of n-type GaAs layer 2 of about 300 nm thickness on the substrate 1.

Then, whole surface of the n-type GaAs layer 2 is covered with a insulation film 9.

For preventing surface oxidation because of electrochemical reaction of GaAs during usage, the GaAs surface must be maintained not to be exposed to oxygen in the deposition procedure of the insulation film 9. For the purpose, the insulation film 9 is preferably to be formed of materials without oxygen, such as silicon nitride (SiN) or aluminum nitride, of which SiN film is the best considering easiness of processing after deposition and easiness of obtaining high resistance value.

Figure 1B:
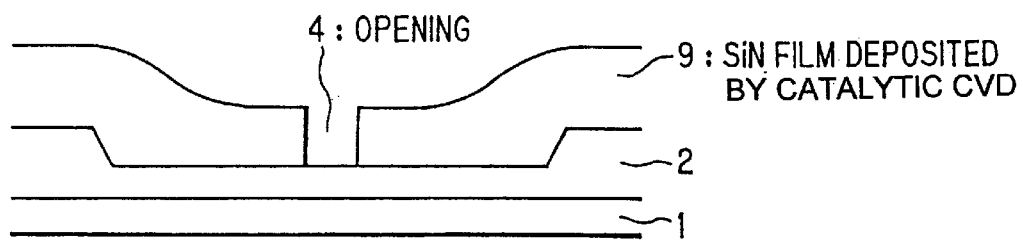

In FIG. 1B, the SiN film is applied to the insulation film 9. As for raw material gas of silicon for catalytic CVD of the SiN film 9, monosilane ($SiH_4$) or disilane ($Si_2H_6$) is available, and nitrogen gas ($N_2$) or ammonia ($NH_3$) for that of nitrogen. Among combinations thereof, combination of $SiH_4$ and $NH_3$ is the best, giving the highest reaction efficiency.

In the case of $SiH_4$ and $NH_3$, high reaction efficiency is obtained when their flow-rate is set in a range of 50 to 200. The best result is obtained when the flow-rate is near 100.

Substrate temperature is preferably set to be 300° C. to 400° C. Deposition rate becomes fairly low when the substrate temperature is under 300° C., and when it is over 400° C., interfacial defects owing to As estranged from the GaAs substrate increases. The temperature of the catalyzer is better to be set between 1300° C. and 1500° C., when tungsten catalyzer is applied, for example, because the SiN film can be well deposited in this temperature range without causing silicide on the catalyzer surface.

Thickness of the SiN film 9 is preferably controlled to be 100 nm to 400 nm. This thickness range enables well-controlled gate length, giving little width dispersion of opening 4 which is to be formed by etching at next process.

Figure 1C:
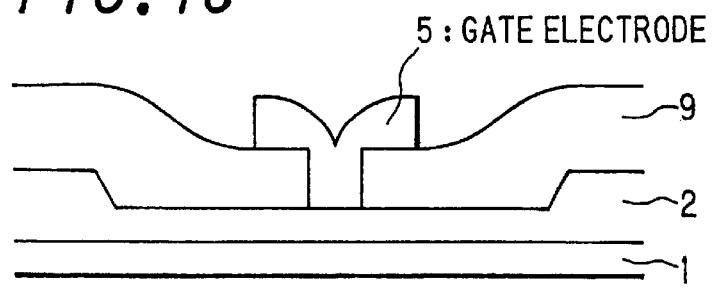

After forming the opening 4 by etching the SiN film 9 making use of photo-resist mask, for example, whole surface of the substrate is covered with a metallic film such as WSi by sputtering, which is etched again for configuring a gate electrode 5, as illustrated in FIG. 1C.

Figure 1D:
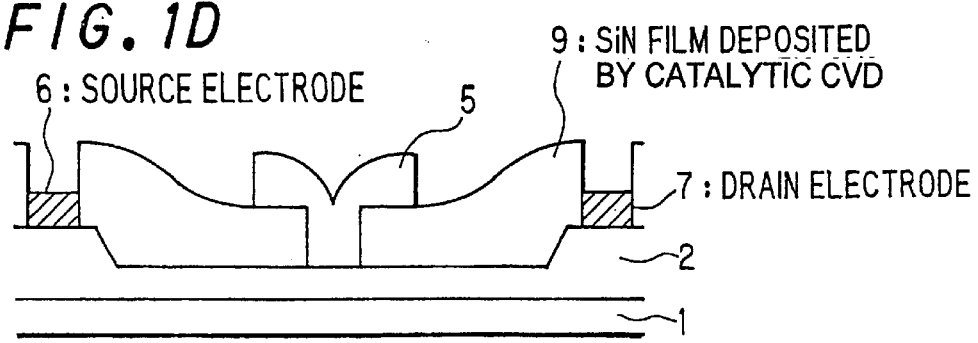

Then, a source electrode 6 and a drain electrode 7 are formed with liftoff method as illustrated in FIG. 1D in openings configured by etching the SiN film 9 making use of a photo-resist mask, for example.

Thus, a MESFET having a structure as illustrated in FIG. 1D is obtained, in the first embodiment.

Figure 2:
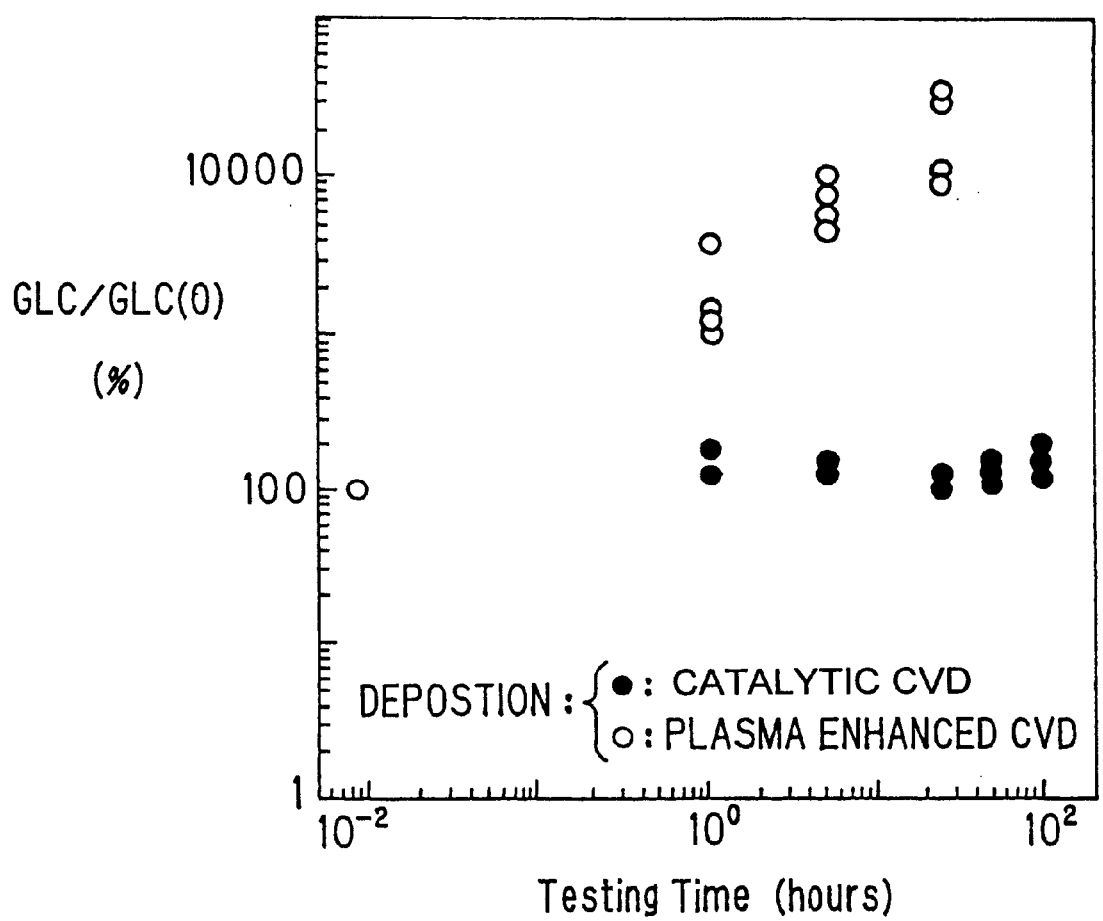
FIG. 2 is a graphic chart illustrating experimental results of aging test of the MESFETs fabricated according to the embodiment compared to the conventional MESFETs wherein the SiN passivation film is deposited by plasma enhanced CVD.

FIG. 2 is a graphic chart illustrating experimental results of aging test of the MESFETs fabricated according to the embodiment compared to the conventional MESFETs wherein the SiN passivation film is deposited by plasma enhanced CVD.

In FIG. 2, x-axis represents aging hours, during which test MESFETs are maintained with their gates impressed with inverse bias near surrender voltage, y-axis representing variation of gate leak current ratio (%).

Black dots represent experimental results of the MESFETs fabricated according to the embodiment on a condition wherein, on the n-type GaAs layer 2 of 300 nm, the insulation film 9 of SiN of 300 nm is deposited by the catalytic CVD from raw material gas of $SiH_4$ and $NH_3$ having a flow-rate of 100, with a substrate temperature of 300° C. and a catalyzer temperature of 1300° C.

Compared to white dots representing experimental results of the conventional MESFETs, it is understood that the degradation because of increase of the gate leak current is perfectly suppressed in the MESFETs according to the embodiment.

As for the decrease of effective drain current at high frequency, the gate-lag, it is also suppressed perfectly and a good high-frequency performance is obtained.

Further, by HFS (Hydrogen Forward Scattering) method, hydrogen concentration in the SiN film 9 deposited according to the embodiment is measured to be 9.8%, which is about a third to a fourth of the hydrogen concentration in the SiN film deposited by the plasma enhanced CVD. It means that the degradation of breakdown voltage because of electron traps derived in the SiN film 9 is also suppressed compared to the conventional MESFETs.

Still further, the compressive internal stress of the SiN film 9 deposited according to the embodiment shows but about $4 \times 10^8$ dyn/cm$^2$. Hence, the threshold voltage dispersion because of the piezoelectricity can be suppressed in the embodiment within about $\frac{1}{10}$ of the conventional MESFETs.

As heretofore described, the problems previously mentioned of the conventional MESFETs, such as the breakdown voltage degradation owing to the gate leak current increase or the electron traps in the SiN film, the high-frequqncy-operating drain current decrease because of the gate-lag, or the threshold voltage dispersion caused by the interfacial tension, can be all effectively suppressed according to the embodiment.

Now, a second embodiment of the present invention will be described.

In the second embodiment, before depositing the SiN film 9 by the catalytic CVD after configuring the recess 3, a surface cleaning process is provided wherein a gas including active hydrogen is made to flow on the semiconductor substrate surface.

The surface cleaning process may be performed by way of a remote-plasma system or a high-temperature chamber provided separately from the catalytic CVD system. However, it should preferably be performed in the same system where the catalytic CVD is performed for a better cleaning effect. This is because native oxide on the GaAs substrate can be perfectly eliminated by performing the catalytic CVD just after the surface cleaning process in the same system.

After the surface cleaning process, MESFETs of the second embodiment are fabricated in the same way with the first embodiment of FIGS. 1A to 1D. The substrate temperature and the catalyzer temperature for the surface cleaning process are preferably the same with those for the catalytic CVD in order to perform the deposition of SiN films just after the surface cleaning process. The surface cleaning process of several seconds can be effective. However, it is preferably performed for about 5 minutes for cleaning out the semiconductor surface sufficiently, with active hydrogen generated from $NH_3$ cracked by the catalyzer.

By adding $SiH_4$ of $\frac{1}{100}$ of $NH_3$ after the surface cleaning maintaining flow rate of $NH_3$ the same, the SiN film 9 begins to be deposited.

With the surface cleaning process, native oxide on the surface of the n-type GaAs layer 2 and impurities absorbed there such as carbon or sulfur can be eliminated more perfectly and an ideal interface between SiN/GaAs can be obtained.

Figure 3A:
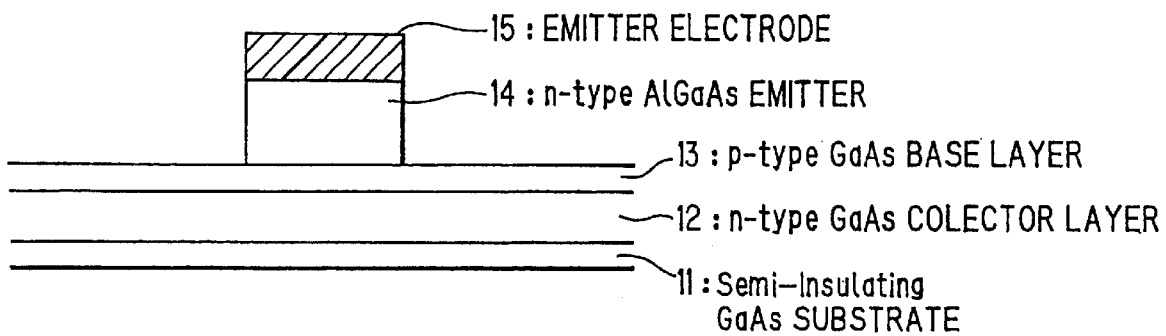
FIGS. 3A to 3C are cross sections illustrating processes of a third embodiment of the present invention applied to fabrication of an HBT (Heterojunction Bipolar Transistor)
Figure 3B:
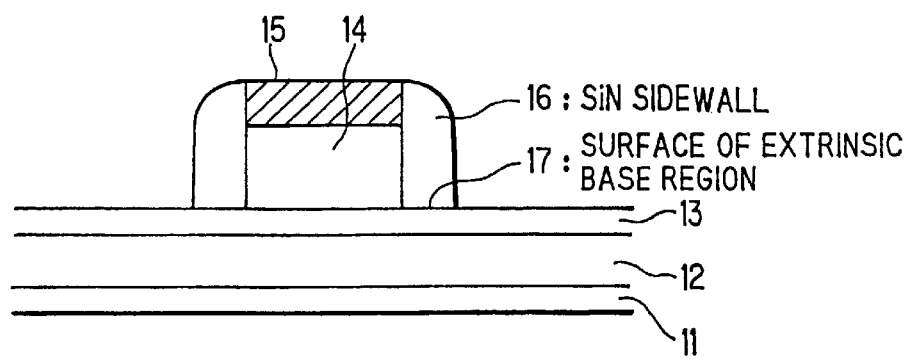
Figure 3C:
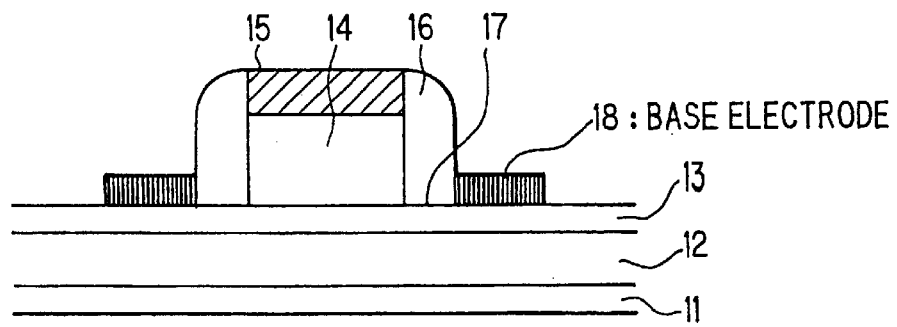
Figure 4A:
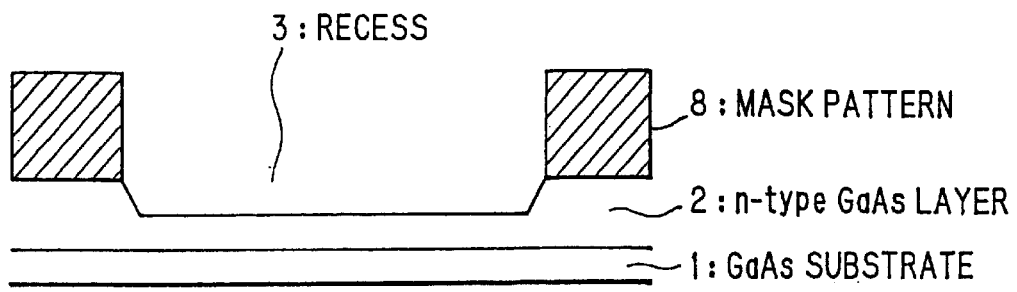
FIGS. 4A to 4D are cross sections schematically illustrating fabrication processes of a conventional high-power GaAs FET.
Figure 4B:
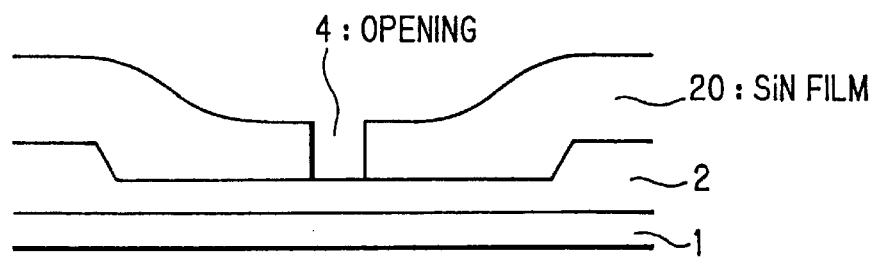
Figure 4C:
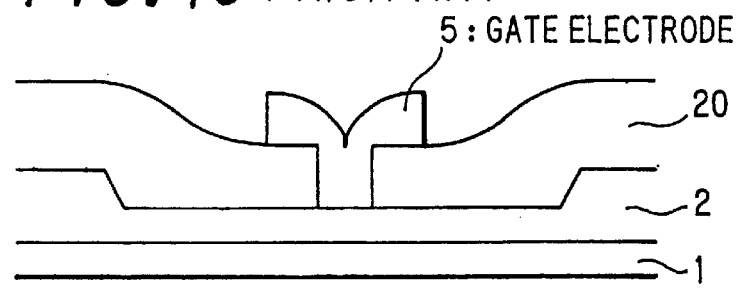
Figure 4D:
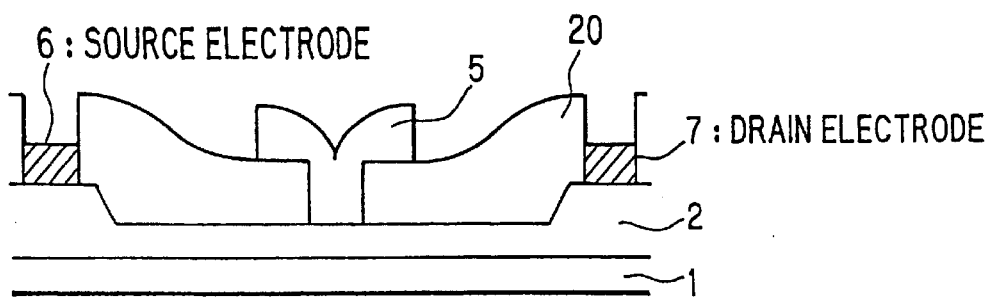
Figure 5:
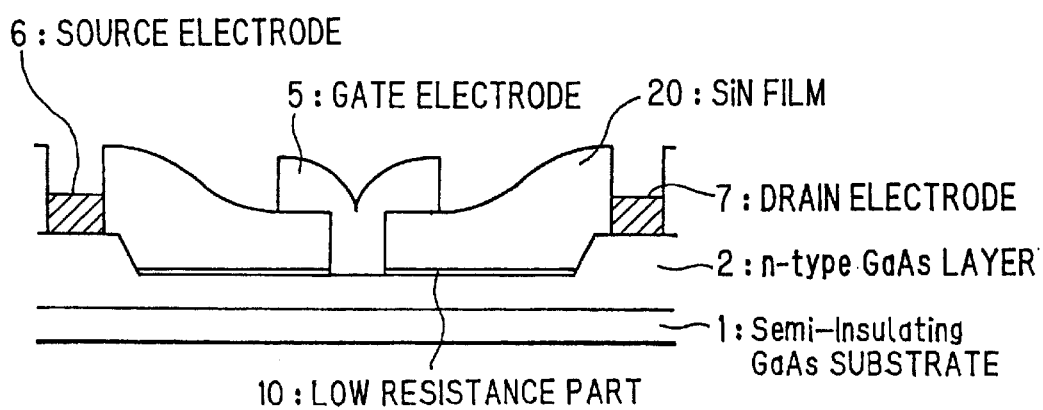
FIG. 5 is a cross section illustrating a low resistance part 10 grown on the surface of an n-type GaAs later 2 traversing a gate 5 and a drain 7 of the conventional high-power GaAs FET of FIG. 4D.

FIGS. 3A to 3C are cross sections illustrating processes of a third embodiment of the present invention applied to fabrication of an HBT (Heterojunction Bipolar Transistor).

On a semi-insulating GaAs substrate 11, an n-type GaAs collector layer 12, a p-type GaAs base layer 13, and an n-type AlGaAs emitter layer are grown, which is then covered by a metallic film of tungsten-silicide (WSi) of about 250 nm, for example. Then, an emitter electrode 15 and an n-type AlGaAs emitter mesa 14 are formed by etching left part of the metallic film and the n-type AlGaAs emitter layer making use of photomask and etching as illustrated in FIG. 3A. Then, a SiN film is deposited on whole surface of the substrate by the catalytic CVD in the same way with the first or the second embodiment.

After the deposition of SiN film, it is etched by anisotropic etching for configuring a SiN wall 16 on the side of the n-type AlGaAs emitter mesa 14 and the emitter electrode 15, as illustrated in FIG. 3B. As for thickness of the SiN sidewall 16 which determines a protection surface 17 of the extrinsic base, it is preferable to be about 200 nm, although more than 50 nm can prevent the short-circuit between the emitter and the base electrode. The thickness of the SiN sidewall 16 is determined from stepping part deposition rate of the SiN film and the anisotoropicity of the etching. When ordinary RIE (Reactive Ion Etching) is applied making use of $CF_4$ as the etching gas, the deposition thickness of the SiN film is suitable to be about 300 nm for configuring the SiN sidewall 16 of about 200 nm.

Then, covering whole surface of the substrate with a metallic film by evaporation or sputtering, and processing the metallic film by reactive dry etching or ion milling, a base electrode 18 is configured as illustrated in FIG. 3C. In an example of the embodiment, a metallic film of a lamination of Ti, Pt and Au is formed by evaporation making use of electron beam heating and processed by ion milling for configuring the base electrode 18.

Thus, a mesa type HBT having a SiN sidewall 16 deposited by the catalytic CVD is obtained according to the third embodiment, wherein interfacial states density at the extrinsic base surface 17 of the p-type GaAs base layer 13 contacting the SiN sidewall 16 is reduced compared to the conventional HBT having a $SiO_2$ sidewall. Therefore, the surface recombination current at the extrinsic base surface 17 can be reduced, suppressing the emitter size effect remarkably.

Heretofore, an example of the third embodiment applied to an AlGaAs/GaAs HBT is described referring to FIGS. 3A to 3C. However, the same effect can be obtained also in mesa type HBTs made of other materials such as InGaP/GaAs or in HBTs having a graded epitaxial layer structure wherein crystal composition changes gradually from the base layer to the emitter layer.

As heretofore described, by depositing the SiN surface passivation film of compound semiconductor devices by way of catalytic CVD instead of conventional plasma enhanced CVD, plasma damage of the semiconductor surface can be eliminated in the present invention enabling to suppress the gate lag and the increase of gate leak current during usage.

Further, since hydrogen density in the SiN surface passivation film deposited according to the invention is reduced to $\frac{1}{3}$ of the conventional plasma enhanced CVD film, variation of breakdown voltage owing to charging/discharging of the electron traps can be suppressed as well.

And further, since the internal stress of the SiN surface passivation film deposited according to the invention is reduced to $\frac{1}{10}$ of the conventional plasma enhanced CVD film, dispersion of the threshold voltage in the narrow gate FET can be also reduced.

Still further, in the mesa type HBT fabricated according to the invention, there are but fewer recombination centers on the extrinsic base surface compared to conventional mesa type HBTs having a sidewall made of $SiO_2$. Therefore, the recombination current can be reduced there, suppressing the emitter size effect.

What is claimed is:

1. A method of fabricating a semiconductor device having a high-resistance film covering a part of a surface of the device other than electrodes of the device, the method comprising the steps of:

cleaning the surface of the device in a catalytic CVD chamber by directing over a surface the device a flow of a gas that includes active hydrogen obtained by cracking $NH_3$ gas; and depositing the high-resistance film on the cleaned surface by catalytic chemical vapor deposition carried out in the same catalytic CVD chamber.

2. The method of claim 1, wherein a flow rate of $NH_3$ during the cleaning step in the catalytic CVD chamber is maintained when beginning the depositing step in the catalytic CVD chamber.

3. The method of claim 2, wherein when the high-resistance film is an SiN film, further comprising the step of adding $SiH_4$ to the flow of $NH_3$ after the cleaning step in order to commence the depositing step.

* * * * *